(12) United States Patent
Chang et al.

(10) Patent No.: US 8,569,789 B2
(45) Date of Patent: Oct. 29, 2013

(54) LIGHT EMITTING DIODE PACKAGE WITH REFLECTIVE LAYER

(75) Inventors: Chao-Hsiung Chang, Hsinchu (TW); Hou-Te Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 4 days.

(21) Appl. No.: 13/288,030

(22) Filed: Nov. 3, 2011

(65) Prior Publication Data

US 2012/0212964 A1 Aug. 23, 2012

(30) Foreign Application Priority Data

Feb. 23, 2011 (CN) .......................... 2011 1 0040688

(51) Int. Cl.
*H01L 33/00* (2010.01)
*H01L 27/15* (2006.01)
*H01L 21/00* (2006.01)

(52) U.S. Cl.
USPC ................. 257/99; 257/79; 257/98; 257/100; 257/E33.06; 257/E33.062; 257/E33.072; 257/E33.059; 257/E33.075; 257/E33.068; 438/22; 438/27; 438/28; 438/29

(58) Field of Classification Search
None
See application file for complete search history.

(56) References Cited

U.S. PATENT DOCUMENTS

| 3,739,217 | A | * | 6/1973 | Bergh et al. | .................... 313/499 |
| 2008/0067534 | A1 | * | 3/2008 | Hsieh et al. | ..................... 257/98 |
| 2009/0057698 | A1 | * | 3/2009 | Okamura et al. | ............... 257/98 |
| 2009/0278153 | A1 | * | 11/2009 | Cho | ................... 257/98 |
| 2010/0320490 | A1 | * | 12/2010 | Lin et al. | ......................... 257/98 |
| 2011/0031502 | A1 | * | 2/2011 | Bergmann et al. | .............. 257/77 |

* cited by examiner

*Primary Examiner* — Fernando L Toledo
*Assistant Examiner* — Harpreet Singh
(74) *Attorney, Agent, or Firm* — Altis & Wispro Law Group, Inc.

(57) ABSTRACT

An LED package includes a substrate, a transparent base, an LED chip and a reflective layer. The substrate has an upper surface. The transparent base is arranged on the upper surface of the substrate. The transparent base includes a first surface away from the substrate and a second surface opposite to the first surface. The LED chip is arranged on the first surface of the transparent base. The reflective layer is arranged between the substrate and the second surface of the transparent base.

5 Claims, 4 Drawing Sheets

LIGHT EMITTING DIODE PACKAGE WITH REFLECTIVE LAYER

BACKGROUND

1. Technical Field

The disclosure relates to light emitting diode (LED) packages, and particularly to a light emitting diode package with even distribution of light emission and high light extraction efficiency.

2. Discussion of Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

However, the conventional LED illumination apparatus generally has a radiation angle about 120 degrees and generates a butterfly-type light field. The intensity of light emitted by the LED illumination apparatus dramatically decreases when the radiation angle exceeds 120 degrees.

Therefore, what is needed is an LED package which can overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present light emitting diode package for microminiaturization. Moreover, in the drawings, like reference numerals designate corresponding parts throughout the several views.

DETAILED DESCRIPTION OF EMBODIMENTS

Figure 1:
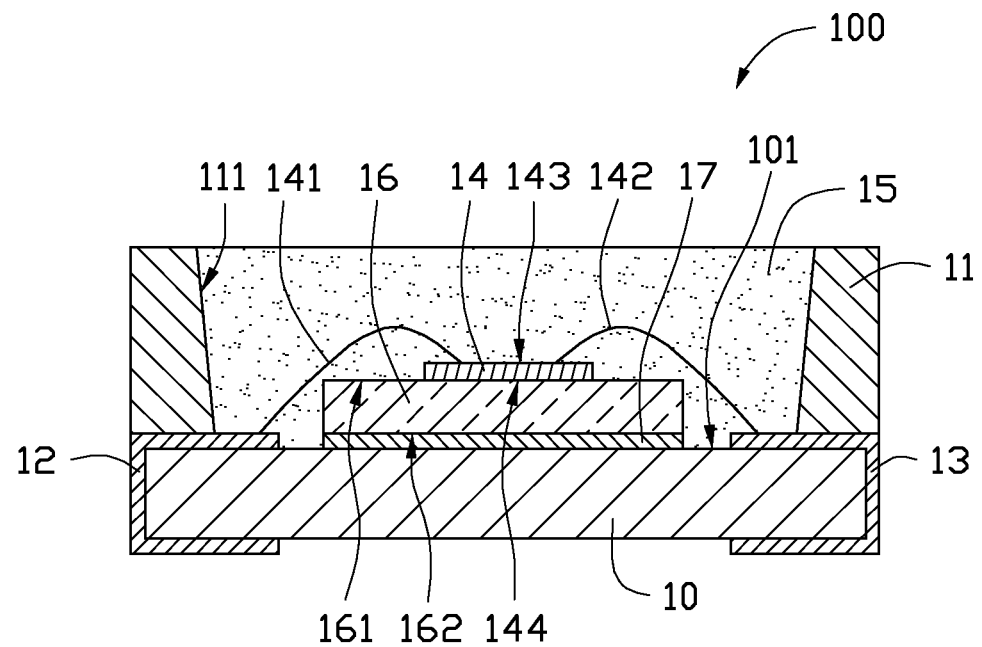
FIG. 1 is cross-sectional view of an LED package in accordance with a first embodiment of the present disclosure.

Referring to FIG. 1, an LED package 100 in accordance with a first embodiment of the present disclosure is illustrated. The LED package 100 includes a substrate 10, an LED chip 14 mounted over the substrate 10, an annular reflecting cup 11 arranged on the substrate 10 and surrounding the LED chip 14, a first electrical portion 12 and a second electrical portion 13 formed on two ends of the substrate 10, an encapsulant 15 received in the reflecting cup 11 and covering the LED chip 14, a transparent base 16 and a reflective layer 17 arranged between the substrate 10 and the LED chip 14.

The substrate 10 beneficially is a single rectangular plate and has a planar upper surface 101. The first electrical portion 12 and the second electrical portion 13 extend from the upper surface 101 to a bottom face (not labeled) of the substrate 10 along an outer edge of the substrate 10, whereby the LED package 100 is formed as a surface mounting type device.

The reflecting cup 11 surrounds the LED chip 14. The reflecting cup 11 defines a recess (not labeled) at a center thereof. In the present embodiment, a reflective coating (not shown) is coated on an inner surface 111 of the reflecting cup 11, and the reflective coating can be argentine layer, copper layer, or other optical reflective coatings. The reflecting cup 11 can be made of a mixture which includes titanium dioxide ($TiO_2$), hardener, and a compound of epoxy resin and silicone. Also, the substrate 10 and the reflecting cup 11 can be formed integrally from the same material as a single piece, such as liquid crystal polymer (LCP).

The transparent base 16 is arranged on the upper surface 101 of the substrate 10 and located between the first electrical portion 12 and the second electrical portion 13.

In the present embodiment, the transparent base 16 is arranged at a center of a bottom of the reflecting cup 11. The transparent base 16 is substantially rectangular, and has a first surface 161 away from the upper surface 101 of the substrate 10 and a second surface 162 opposite to the first surface 161 and near the upper surface 101 of the substrate 10. The first surface 161 and the second surface 162 are planar surfaces. In the present embodiment, the transparent base 16 is arranged higher than the first and second electrical portions, 12 13. The transparent base 16 is made of glass. The transparent base 16 can transmit light emitted from the LED chip 14, and dissipate heat generated from the LED chip 14. In an alternative embodiment, the transparent base 16 can be made of silicone, or epoxy resin.

The reflective layer 17 is arranged between the second surface 162 of the transparent base 16 and the upper surface 101 of the substrate 10. In the present embodiment, a bottom surface of the reflective layer 17 directly contacts the upper surface 101 of the substrate 10, and a top surface of the reflective layer 17 is substantially coplanar with top sides of the first and second electrical portions 12, 13. The reflective layer 17 is spaced and electrically isolated from the first electrical portion 12 and the second electrical portion 13. The reflective layer 17 can be made of metal, such as aluminum, argentine or copper.

The LED chip 14 is arranged on a center of the first surface 161 of the transparent base 16. A first electrode (not labeled) of the LED chip 14 is electrically connected to the first electrical portion 12 via a first wire 141, and a second electrode (not labeled) of the LED chip 14 is electrically connected to the second electrical portion 13 via a second wire 142. The LED chip 14 has a first light emitting surface 143 away from the transparent base 16 and a second light emitting surface 144 opposite to the first light emitting surface 143. The second light emitting surface 144 faces and contacts the first surface 161 of the transparent base 16.

The encapsulant 15 is received in the reflecting cup 11 and covers the LED chip 14, and is made of transparent materials, such as silicone, epoxy, quartz, or glass. In this embodiment, a top surface of the encapsulant 15 is substantially coplanar with a top surface of the reflecting cup 11.

In work, light emitted from the first emitting surface 143 of the LED chip 10 travels through the encapsulant 15 or is reflected by the inner surface 111 of the reflecting cup 11 and then radiates through the encapsulant 15 to an outside of the LED package 100 for lighting. On the other hand, light emitted from the second emitting surface 144 of the LED chip 10 travels through the transparent base 16, and then is reflected by the reflective layer 17, and finally travels out of the encapsulant 15 to the outside with different directions; therefore, the light emission of the LED package 100 can be substantially evenly distributed. Furthermore, light emitted from the second emitting surface 144 of the LED chip 10 can transfer through the encapsulant 15 to the outside; therefore, it can improve a light extraction efficiency of the LED package 10.

Figure 2:
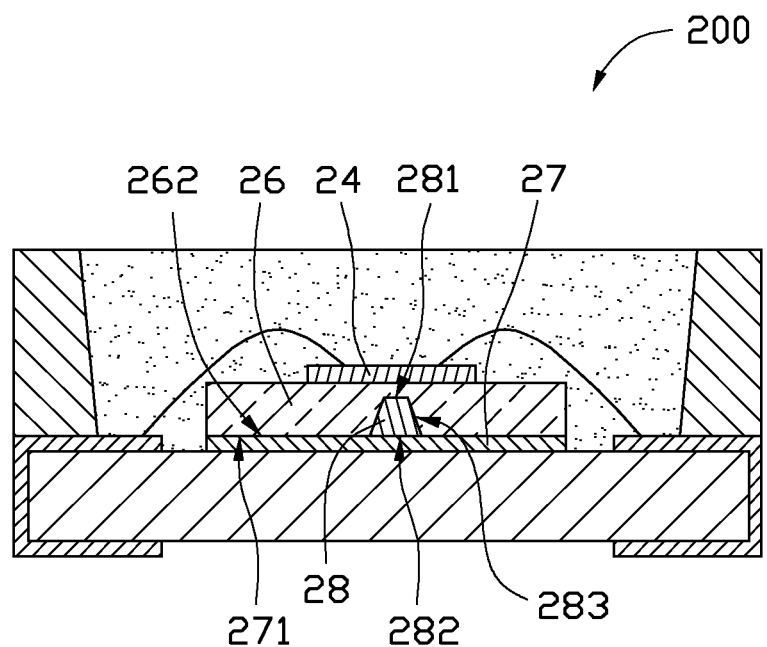
FIG. 2 is cross-sectional view of an LED package in accordance with a second embodiment of the present disclosure.

Referring to FIG. 2, an LED package 200 in accordance with a second embodiment of the present disclosure is illustrated. The LED package 200 is similar to the LED package 100 of the first embodiment. Differing from the LED package 100 of the first embodiment, the LED package 200 further includes a reflective member 28. The reflective member 28 is arranged on a center of a top surface 271 of the reflective layer 27, and extends to the transparent base 26. A cross sectional view of the reflective member 28 has a trapezium shape. The reflective member 28 has outer reflecting surfaces which include a top surface 281 inside the transparent base 26, a bottom surface 282 opposite to the top surface 281 and side surfaces 283 between the top and bottom surfaces 281, 282. An area of the bottom surface 282 is larger than that of the top surface 281; therefore, the side surfaces 283 of the reflective member 28 are inclined, whereby the reflective member 28 can effectively reflect light emitted from the LED chip 24. The transparent base 26 is higher than the reflective member 28. A bottom surface 262 of the transparent base 26, the top surface 271 of the reflective layer 27 and the bottom surface 282 of the reflective member 28 are substantially coplanar. In an alternative embodiment, the reflective member 28 and the reflective layer 27 can be formed integrally from the same material as a single piece, such as argentine or copper.

The top surface 281 and the side surfaces 283 of the reflective member 28 reflects light emitted from the LED chip 24 to the outside with different directions.

Figure 3:
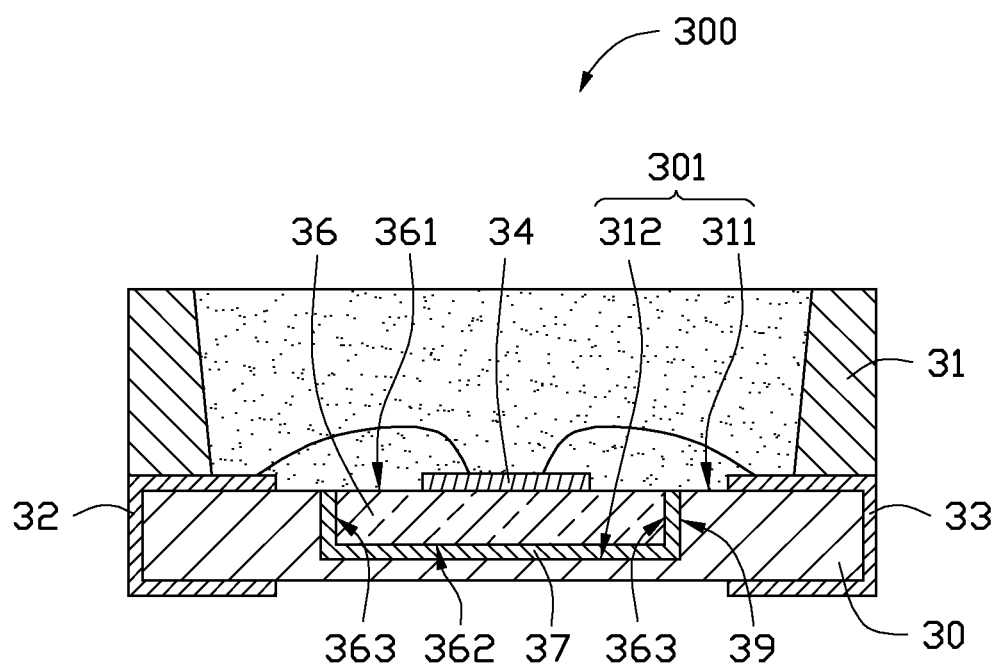
FIG. 3 is cross-sectional view of an LED package in accordance with a third embodiment of the present disclosure.

Referring to FIG. 3, an LED package 300 in accordance with a third embodiment of the present disclosure is illustrated. The LED package 300 is similar to the LED package 100 of the first embodiment. Differing from the LED package 100 of the first embodiment, a groove 39 concaves downwards from a central portion of an upper surface 301 of a substrate 30 of the LED package 300, and thus divides the upper surface 301 into a first part 311 surrounding the groove 39 and a second part 312 at a bottom of the groove 39. First electrical portion 32 and second electrical portion 33 extend from the first part 311 of the upper surface 301 of the substrate 30 to a bottom face (not labeled) of the substrate 30 along an outer edge of the substrate 30, and parts of the first electrical portion 32 and the second electrical portion 33 are exposed within a reflecting cup 31. A transparent base 36 is received in the groove 39. The transparent base 36 includes a first surface 361 away from the second part 312 of the upper surface 301 of the substrate 30, a second surface 362 opposite to the first surface 361, and side surface 363 arranged between the first surface 361 and the second surface 362. An LED chip 34 is arranged on a center of the first surface 361 of the transparent base 36. A reflective layer 37 is arranged in the groove 39 and located between the transparent base 36 and the substrate 30. In the present embodiment, the first part 311 of the upper surface 301 of the substrate 30 and the first surface 361 of the transparent base 36 are coplanar; therefore, the height of the LED package 300 can be reduced.

Figure 4:
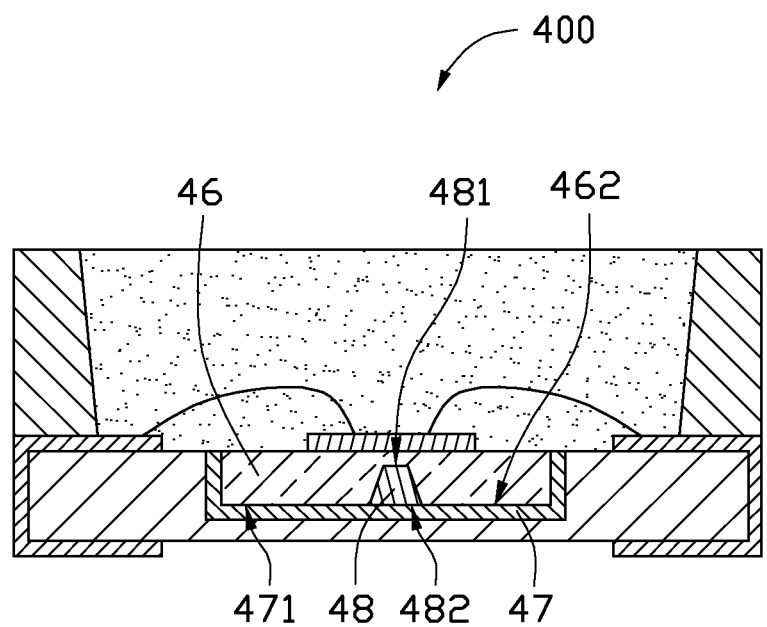
FIG. 4 is cross-sectional view of an LED package in accordance with a fourth embodiment of the present disclosure.

Referring to FIG. 4, an LED package 400 in accordance with a fourth embodiment of the present disclosure is illustrated. The LED package 400 is similar to the LED package 300 of the third embodiment. Differing from the LED package 300 of the third embodiment, the LED package 400 further includes a reflective member 48 in a transparent base 46 thereof. The reflective member 48 is arranged on a center of a top surface 471 of a reflective layer 47 and extends into the transparent base 46. The reflective member 48 has a configuration similar to the reflective member 28 of the second embodiment, as shown in FIG. 2, and includes a top surface 481 away from a bottom surface 462 of the transparent base 46 and a bottom surface 482 opposite to the top surface 481. An area of the bottom surface 482 is larger than that of the top surface 481. The transparent base 46 is higher than the reflective member 48.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. An LED package, comprising:
 a substrate having an upper surface and a lower surface opposite to the upper surface;
 a first electrical portion and a second electrical portion extending from the upper surface of the substrate to the lower surface thereof;
 a transparent base arranged on the upper surface of the substrate, the transparent base comprising a top surface and a bottom surface opposite to the top surface and a side surface interconnecting the top and bottom surfaces;
 an LED chip arranged on the top surface of the transparent base; and
 a reflective layer arranged between the substrate and the transparent base, the reflective layer being spaced and electrically isolated from the first electrical portion and the second electrical portion;
 wherein a groove concaves downwards from a central portion of the upper surface of the substrate of the LED package, the upper surface of the substrate being divided into a first part surrounding the groove and a second part at a bottom of the groove, the transparent base being arranged on the second part of the upper surface of the substrate; and
 wherein the reflective layer is arranged on the bottom surface and the side surface of the transparent base and located between the transparent base and the substrate.

2. An LED package, comprising:
 a substrate having an upper surface;
 a reflecting cup arranged on the substrate and defining a recess at a center thereof;
 a first electrical portion and a second electrical portion formed on two ends of the substrate;
 a transparent base arranged on the upper surface of the substrate and located between the first electrical portion and the second electrical portion;
 an LED chip arranged on the transparent base and electrically connecting with the first and second electrical portions; and
 a reflective layer arranged between the substrate and the transparent base, the reflective layer being spaced and electrically isolated from the first electrical portion and the second electrical portion;
 wherein a groove concaves downwards from a central portion of the upper surface of the substrate of the LED package, the upper surface of the substrate being divided into a first part surrounding the groove and a second part at a bottom of the groove, the transparent base being arranged on the second part of the upper surface of the substrate.

3. The LED package of claim 2, wherein the reflective layer has a top surface away from the second part of the upper surface of the substrate, the LED package further comprising a reflective member located on the top surface of the reflective layer and extending into the transparent base.

4. The LED package of claim 2, wherein the transparent base is higher than the reflective member.

5. An LED package, comprising:
- a substrate having an upper surface and a lower surface opposite to the upper surface;
- a first electrical portion and a second electrical portion extending from the upper surface of the substrate to the lower surface thereof;
- a transparent base arranged on the upper surface of the substrate, the transparent base comprising a top surface and a bottom surface opposite to the top surface and a side surface interconnecting the top and bottom surfaces;
- an LED chip arranged on the top surface of the transparent base;
- a reflective layer arranged between the substrate and the transparent base, the reflective layer being spaced and electrically isolated from the first electrical portion and the second electrical portion; and
- a reflective member located in the transparent base, the reflective member having a bottom surface contacting with the reflective layer;

wherein the reflective member is made of silver or copper.

\* \* \* \* \*